(12) United States Patent
Hsiao et al.

(10) Patent No.: US 12,374,814 B2
(45) Date of Patent: Jul. 29, 2025

(54) ELECTRICAL CONNECTOR WITH IMPROVED HEAT DISSIPATION FEATURE

(71) Applicants: FUDING PRECISION INDUSTRY (ZHENGZHOU) CO., LTD., Zhengzhou (CN); FOXCONN INTERCONNECT TECHNOLOGY LIMITED, Grand Cayman (KY)

(72) Inventors: Shih-Wei Hsiao, New Taipei (TW); Qin-Xin Cao, Kunshan (CN); Yu-San Hsiao, New Taipei (TW); Yen-Chih Chang, New Taipei (TW)

(73) Assignees: FUDING PRECISION INDUSTRY (ZHENGZHOU) CO., LTD., Zhengzhou (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 399 days.

(21) Appl. No.: 17/901,122

(22) Filed: Sep. 1, 2022

(65) Prior Publication Data
US 2023/0074928 A1     Mar. 9, 2023

(30) Foreign Application Priority Data
Sep. 7, 2021   (CN) .......................... 202122141475.0

(51) Int. Cl.
| | |
|---|---|
| *H01R 12/71* | (2011.01) |
| *H01R 12/70* | (2011.01) |
| *H01R 12/73* | (2011.01) |
| *H01R 13/516* | (2006.01) |
| *H05K 7/20* | (2006.01) |

(52) U.S. Cl.
CPC ....... *H01R 12/716* (2013.01); *H01R 12/7005* (2013.01); *H01R 12/73* (2013.01); *H01R 13/516* (2013.01); *H05K 7/2039* (2013.01)

(58) Field of Classification Search
CPC .. H01R 12/716; H01R 12/7005; H01R 12/73; H01R 13/516; H05K 7/2039
USPC ............................................................ 439/74
See application file for complete search history.

(56) References Cited

U.S. PATENT DOCUMENTS

| | | | | |
|---|---|---|---|---|
| 3,149,265 A | * | 9/1964 | Thorn ..................... | H05K 1/184 439/85 |
| 3,261,396 A | * | 7/1966 | Trunk ................. | H01L 23/4006 257/722 |
| 3,833,837 A | * | 9/1974 | West ................... | H05K 7/20909 361/810 |
| 4,006,388 A | * | 2/1977 | Bartholomew .... | H05K 7/20545 361/802 |

(Continued)

FOREIGN PATENT DOCUMENTS

CN      206301971 U     7/2017

*Primary Examiner* — Phuong K Dinh
(74) *Attorney, Agent, or Firm* — Ming Chieh Chang

(57) ABSTRACT

An electrical connector includes a bracket having a plurality of mating frames arranged side by side in a lateral direction and opening forward and plural transition modules inserted forward to be at least partially accommodated in the mating frame, wherein the bracket defines plural heat dissipation grooves each located between two adjacent frames and plural heat dissipation fins each located in a corresponding heat dissipation groove, the heat dissipation groove opening through in a front-rear direction.

15 Claims, 8 Drawing Sheets

(56) References Cited

U.S. PATENT DOCUMENTS

| | | | | |
|---|---|---|---|---|
| 4,027,206 | A * | 5/1977 | Lee | H05K 7/20909 |
| | | | | 361/761 |
| 6,937,474 | B2 * | 8/2005 | Lee | H01L 23/427 |
| | | | | 361/679.52 |
| 7,375,542 | B2 * | 5/2008 | Teneketges | G01R 31/2889 |
| | | | | 324/762.01 |
| 7,394,149 | B2 * | 7/2008 | Clayton | H05K 1/189 |
| | | | | 257/686 |
| 7,429,788 | B2 * | 9/2008 | Clayton | H05K 1/0278 |
| | | | | 257/E21.705 |
| 7,431,446 | B2 * | 10/2008 | Silverbrook | G06K 1/121 |
| | | | | 400/613 |
| 7,821,790 | B2 * | 10/2010 | Sharma | H05K 7/1424 |
| | | | | 361/725 |
| 7,993,147 | B2 * | 8/2011 | Cole | H01R 13/6473 |
| | | | | 439/79 |
| 8,823,540 | B2 * | 9/2014 | Scholeno | H04B 10/801 |
| | | | | 340/815.4 |
| 9,537,239 | B1 * | 1/2017 | Liu | H01R 13/6587 |
| 9,572,245 | B1 * | 2/2017 | Yu | H05K 7/20545 |
| 10,135,211 | B2 * | 11/2018 | Lloyd | H01R 12/79 |
| 10,153,571 | B2 * | 12/2018 | Kachlic | H01R 13/6583 |
| 10,276,985 | B1 | 4/2019 | Amphenol | |
| 10,551,580 | B2 * | 2/2020 | Regnier | G02B 6/4269 |
| 10,693,249 | B2 | 6/2020 | Molex | |
| 2016/0365654 | A1 * | 12/2016 | Wormsbecher | H05K 7/20136 |

* cited by examiner

ELECTRICAL CONNECTOR WITH IMPROVED HEAT DISSIPATION FEATURE

BACKGROUND OF THE INVENTION

1. Field of the Invention

The present invention relates to an electrical connector with better heat dissipation.

2. Description of Related Arts

U.S. Pat. No. 7,993,147 discloses an electrical connector mounted on a circuit board for connecting a plurality of cards, which comprises a housing and a plurality of contact module assemblies at least partially arranged on the housing. The housing defines a plurality of card edge slots for receiving the cards. There is a solid wall between adjacent two card edge slots such that heat dissipation is poor.

Therefore, it is desired to provide an electrical connector with better heat dissipation.

SUMMARY OF THE INVENTION

Therefore, the instant invention is to provide an electrical connector with better heat dissipation. To achieve the above-mentioned object, an electrical connector for connecting plural cards to a printed circuit board comprises: a bracket having a plurality of mating frames arranged side by side in a lateral direction and opening forward for receiving the cards; and a plurality of transition modules inserted forward to be at least partially accommodated in the mating frame for electrically connecting the card and the printed circuit board, wherein the bracket defines a plurality of heat dissipation grooves each located between two adjacent frames and a plurality of heat dissipation fins each located in a corresponding heat dissipation groove, the heat dissipation groove opening through in a front-rear direction.

Other advantages and novel features of the invention will become more apparent from the following detailed description of the present embodiment when taken in conjunction with the accompanying drawings.

DETAILED DESCRIPTION OF THE PREFERRED EMBODIMENTS

Figure 1:
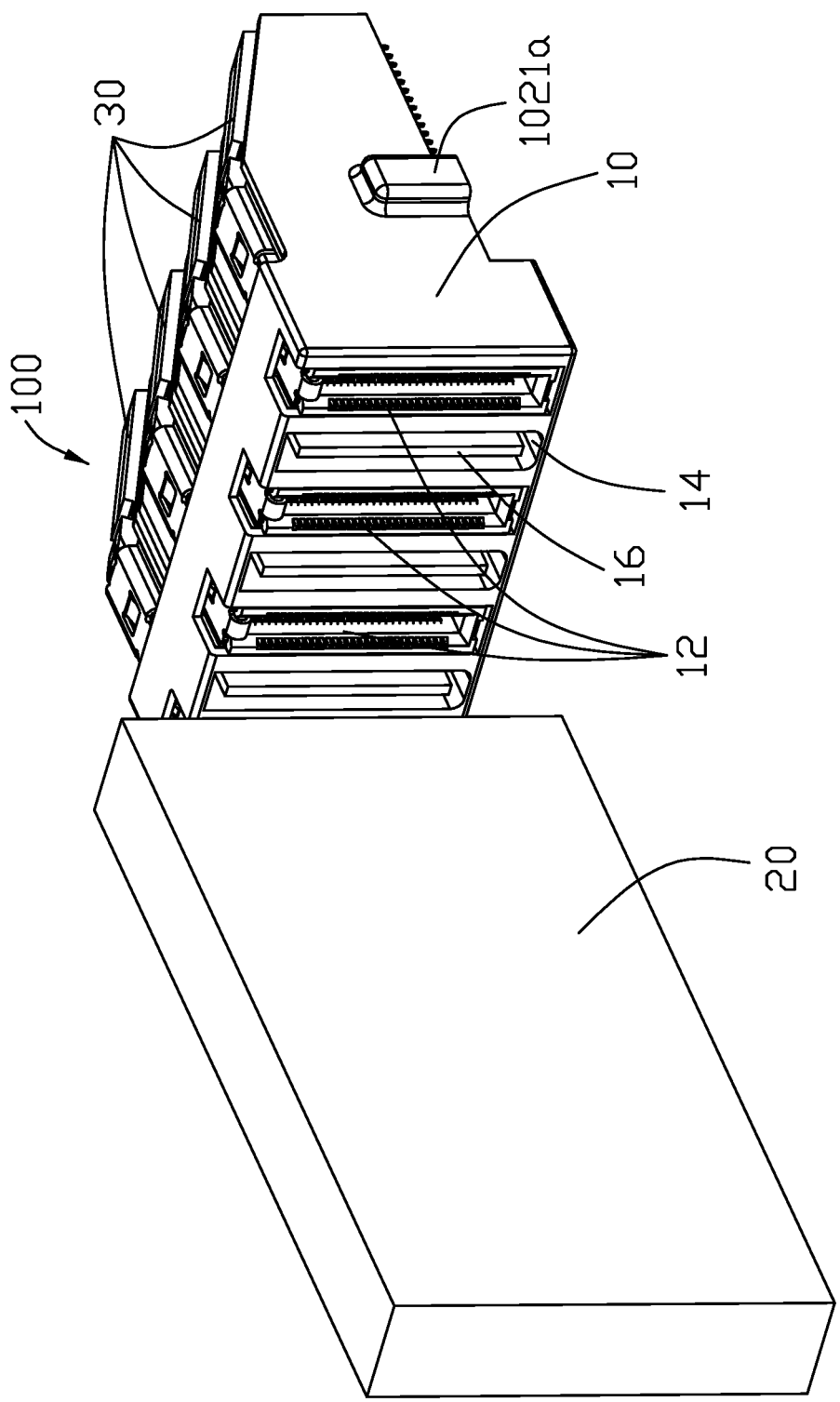
FIG. 1 is a perspective view of an electrical connector of a first embodiment of the present invention, wherein a frame is inserted with a card.
Figure 2:
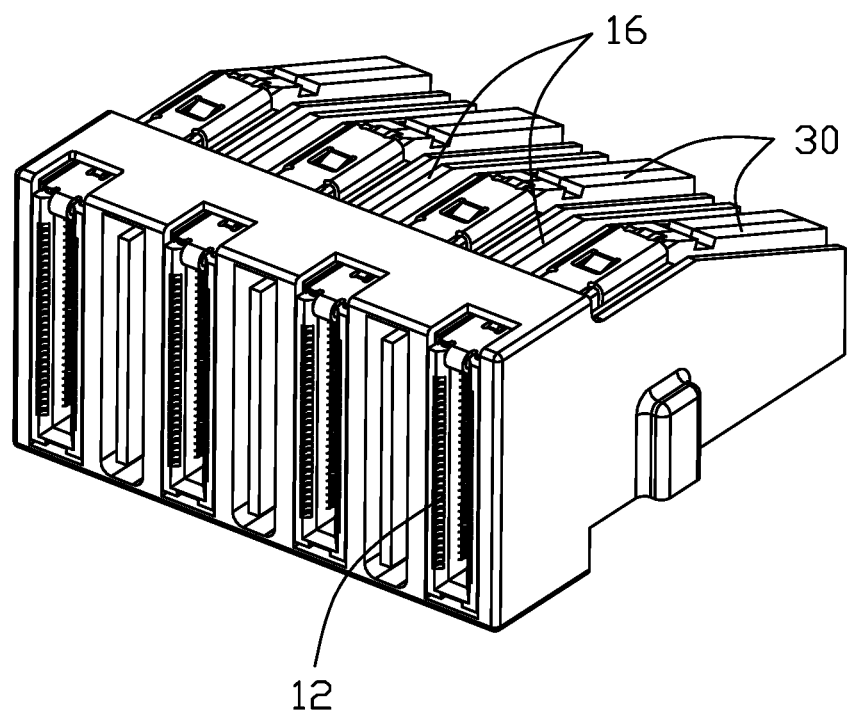
FIG. 2 is a perspective view of an electrical connector of a first embodiment of the present invention.

Referring to FIGS. 1-7 illustrating an electrical connector 100 of a first embodiment of this invention to be mounted on a printed circuit board, the electrical connector 100 is used for electrically connecting a plurality of cards 20. The electrical connector 100 comprises a bracket 10 and a plurality of transition modules 30 for electrically connecting the cards 20 and the circuit board. The bracket 10 comprises a plurality of mating frames 12 arranged side by side in a lateral direction, each mating frame defines an upright card slot opening forward for an insertion of the cards. The transition modules 30 are inserted into mating frame from a rear end and at least partially are accommodated in the mating frame 12. The bracket 10 further defines a heat dissipation groove 14 located between two adjacent frames 12 and open in the front-rear direction. A heat dissipation fin 16 is arranged in the heat dissipation groove 14.

Figure 4:
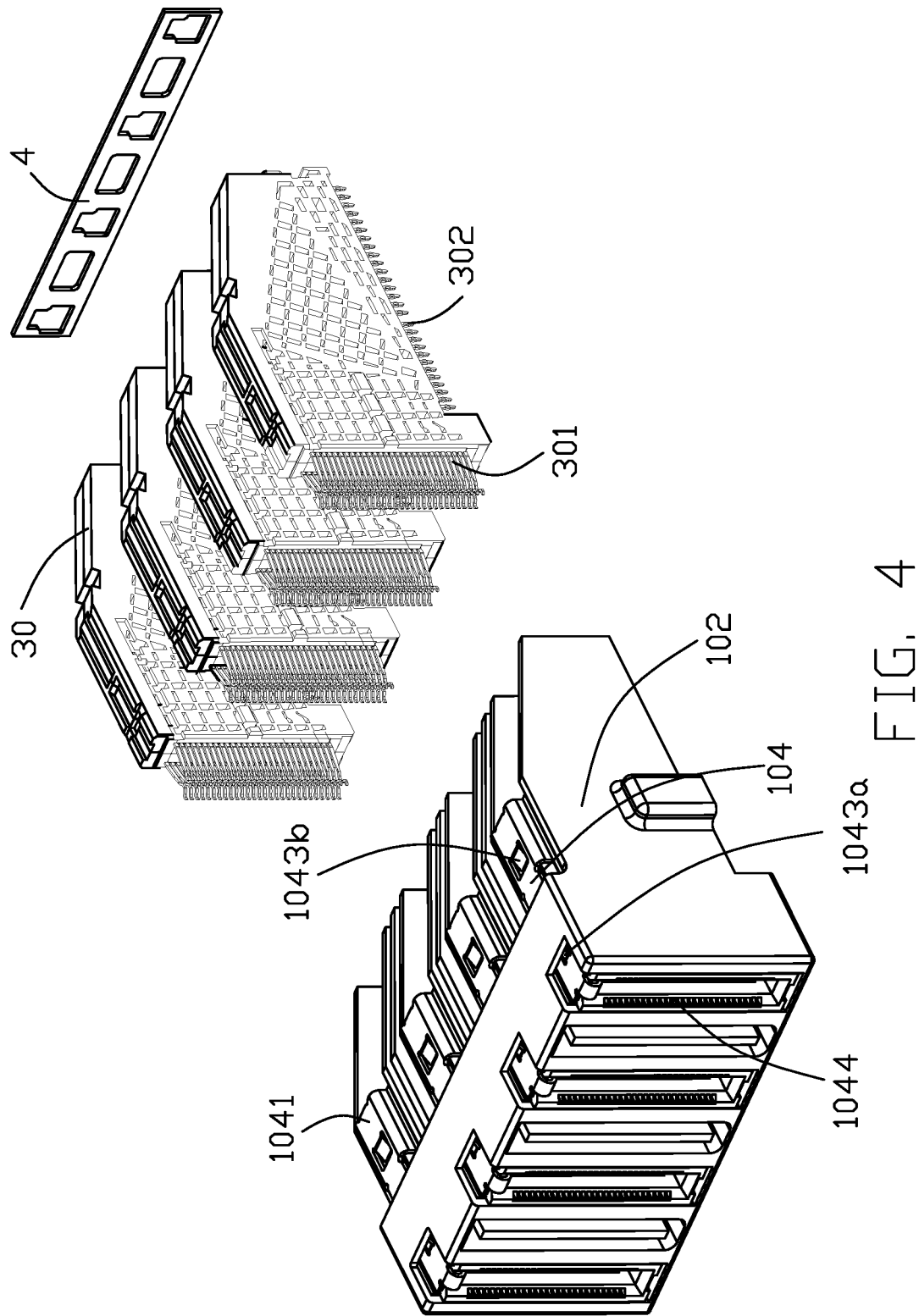
FIG. 4 is an exploded perspective view of the electrical connector of FIG. 2.
Figure 5:
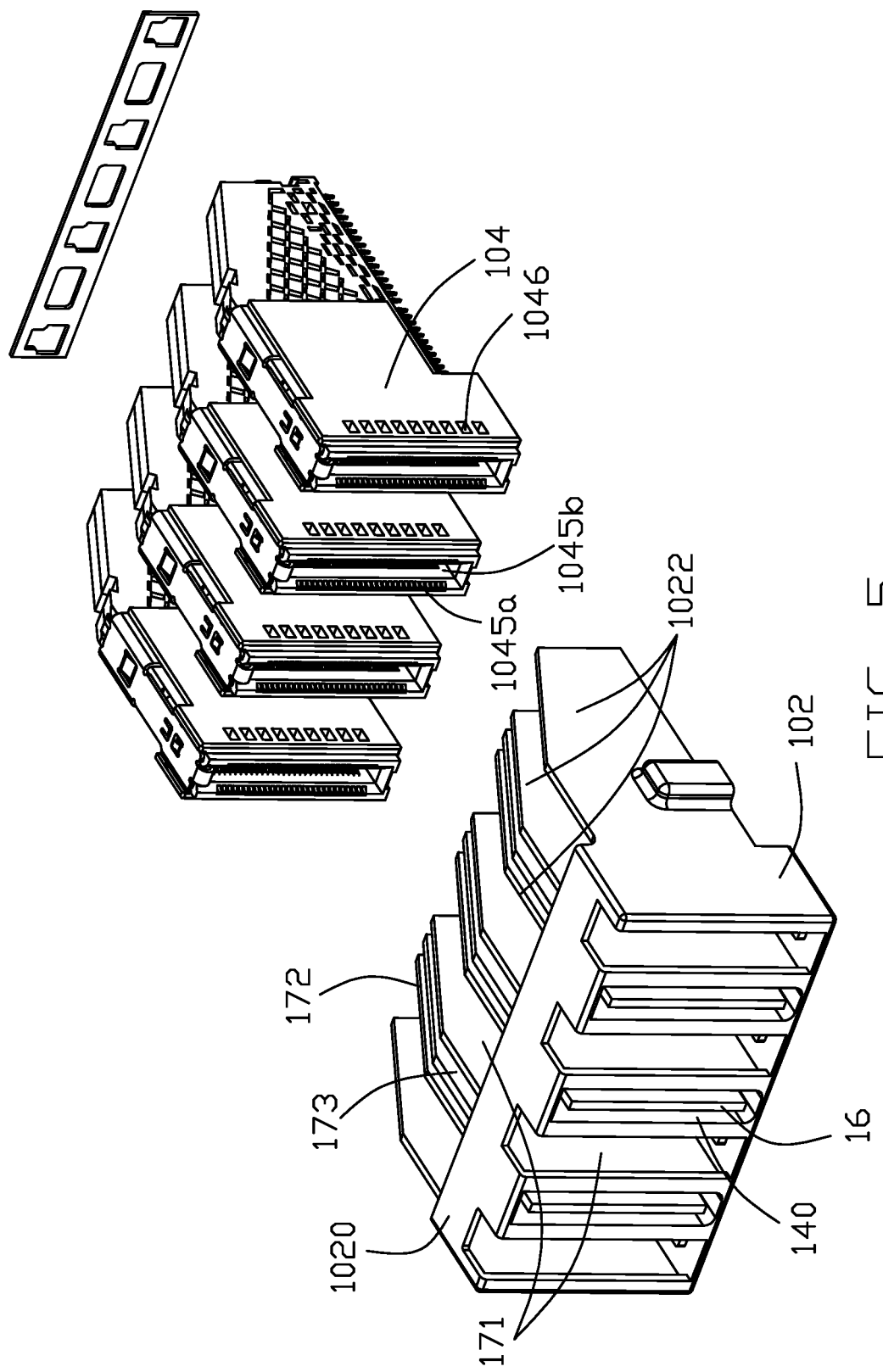
FIG. 5 is another perspective exploded view of the electrical connector assembly of FIG. 2.

Referring to FIGS. 4-5, the bracket 10 includes a metallic housing 102 formed of metal material and a plurality of insulative housings 104 formed of insulative material. Each frame 12 is constructed with the metallic housing 102 and the insulative housing 104 together and the insulative housing 104 is located in an inside of the metallic housing 102. The metallic housing 102 not only is a part of the frame 12 but also forms the heat dissipation grooves 14. In other words, the metallic housing 102 and the insulative housing 104 located in the metallic housing 102 form the frame 12 together. The metallic housing 102 forms the heat dissipation grooves 14 opening through in the front-rear direction between two adjacent frames 12. For a better heat dissipation and convenient processing, the heat dissipation fins 16 are made of metal material. The heat dissipation fins 16 are integrally formed with the metallic housing 102, that is, the heat dissipation fins 16 and the side walls 140 of the heat dissipation groove 14 are integrally formed by metal material. Preferably, the heat dissipation fins 16 extend in the front-rear direction and an upright direction. A gap is defined between the heat dissipation fin 16 and the adjacent side walls 140. The front end of the heat dissipation fin 16 is substantially flushed with the front surface of the bracket 10. The number of heat dissipation fins 16 is selected according to needs. The transition module 30 comprises a first end 301 adapted for being inserted in the frame 12 for mating with the card 20 and a second end 302 for connecting with the printed circuit board. Each transition module 30 comprises a first wafer 301a and a second wafer 301b arranged in parallel. The first wafer 301a or the second wafer 301b respectively comprises a plurality of terminals 303a/303b extending from the first end 301 to the second end 302.

Figure 3:
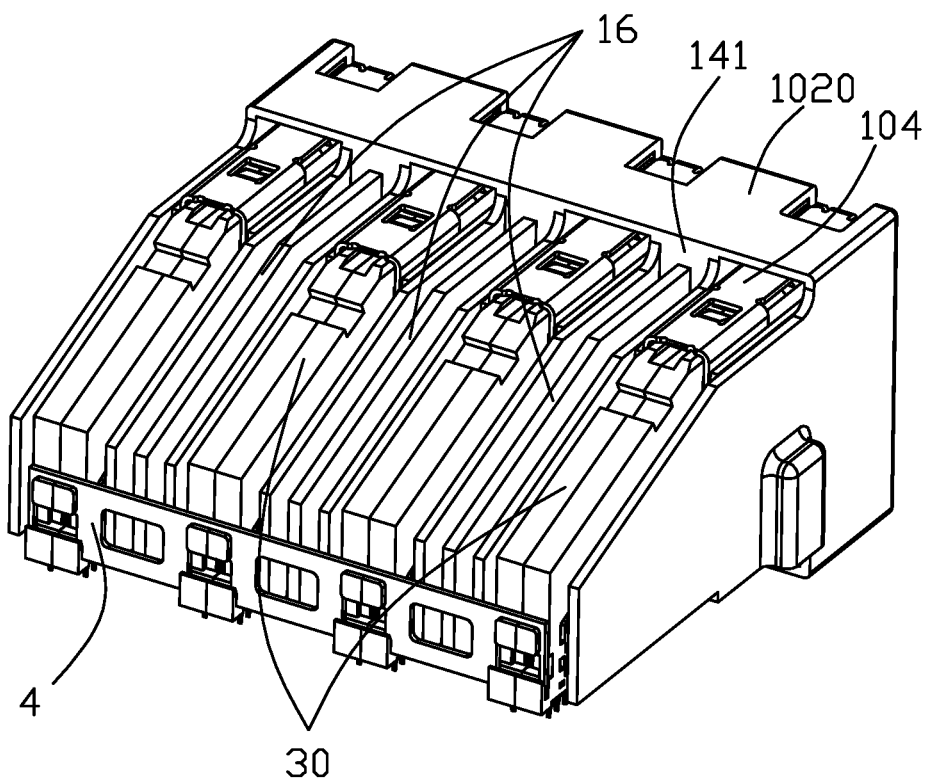
FIG. 3 is a another perspective view of the electrical connector of FIG. 2.
Figure 6:
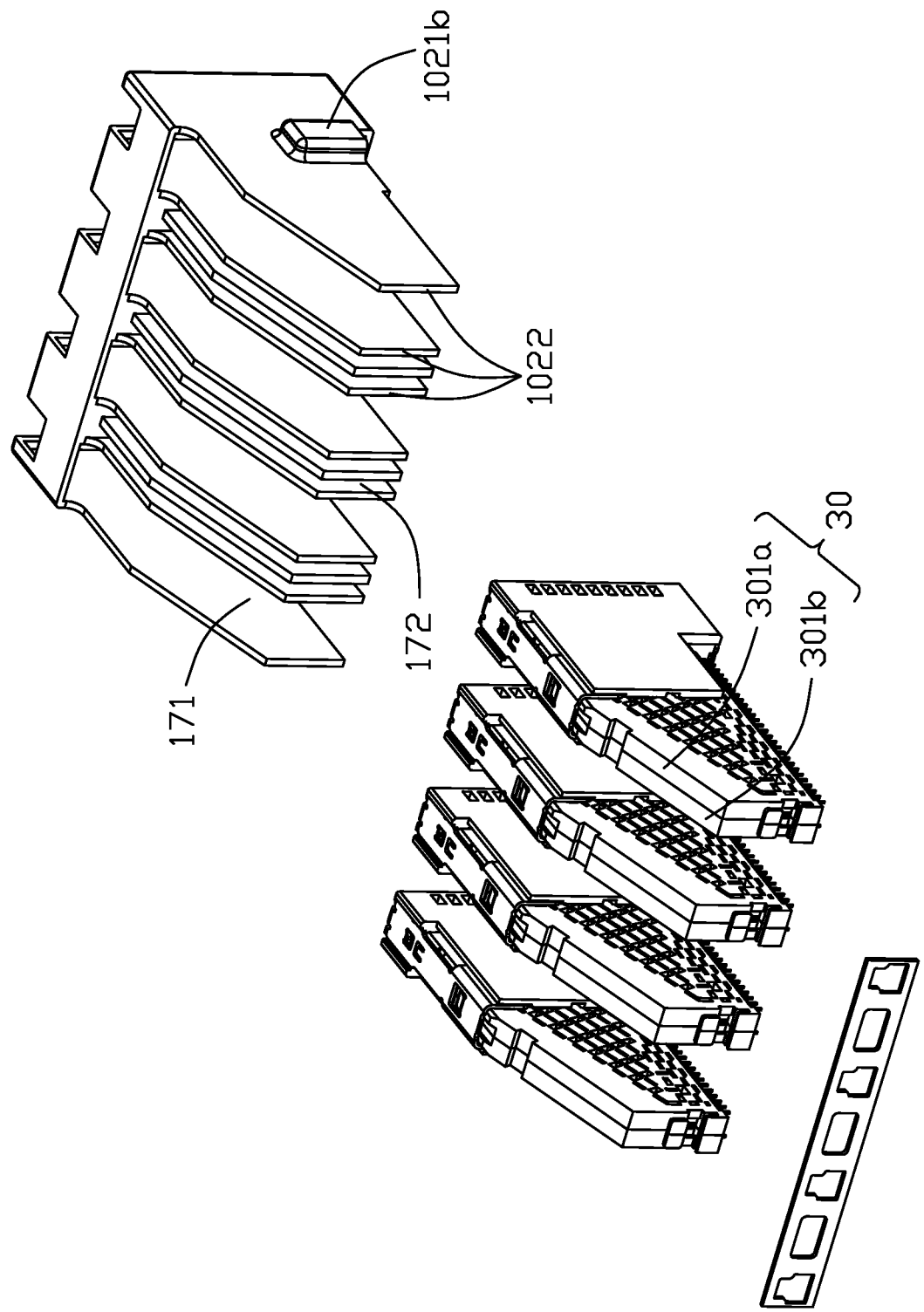
FIG. 6 is an exploded perspective view of the electrical connector of FIG. 3.

Referring specifically to FIGS. 5-6, the metallic housing 102 comprises a main body 1020 extending laterally and a plurality of extending wall 1022 extending backward from the main body 1020. The plurality of insulative housings 104 are arranged in the main body 1020. The transition modules 30 are arranged one to one in the corresponding frame 12 and are located between the corresponding two extending walls 1022. The heat dissipation fin 16 extend backward from the heat dissipation groove 14 and is located between the corresponding extending walls 1022, the heat dissipation fin 16 is substantially parallel to the extending wall 1022. Referring to FIG. 3, the bracket 10 comprises a baffle wall 141 standing transversely in the heat dissipation groove 14. The outer periphery of the baffle wall 141 is connected with the inner wall of the heat dissipation groove 14, so that the baffle wall 141 blocks the heat dissipation groove 14 along the front-rear direction. The heat dissipation fin 16 is fixed in the heat dissipation groove 14 by the baffle wall 141. Preferably, the baffle wall 141 and the heat dissipation fin 16 are integrally formed. In the present invention, the extending wall 1022 is formed with metal material and extend from the metallic housing 102, which not only increase the heat dissipation area of the metallic housing 102, but also support the transition module 30 located between the two extending walls 1022, so that the structure of the electrical connector 100 is more stable. On the other hand, as shown in FIGS. 5-6, structurally speaking, the metallic housing 102 defines a plurality of upright receiving slots 171 along the lateral direction and each upright slot 171 opening through along a front-rear direction with a mating face at the front side thereof, and comprises a partition wall 172 between every two adjacent upright slots 171, said transition assemblies are received in the upright slots 171, respectively. The partition wall 172 is divided into three parts (i.e., said three extending walls 1022) along the lateral direction, thereby forming two heat dissipation sub-grooves 173 at each partition wall. As clear shown, a front part and a rear part of the heat dissipation sub-groove 173 is separated with the baffle wall 141, the front part only opening forwards while the rear part opening rearward and opening through along an upright direction. The insulative housing 104 is located in the main body 1020 of the metallic housing 102 and extends backwards out of the main body 1020. The electrical connector 100 further includes a bridging portion 4 for connecting the plurality of transition module 30. Preferably, the bridging portion 4 is disposed on an end of the transition module 30 away from the first end 301.

Figure 7:
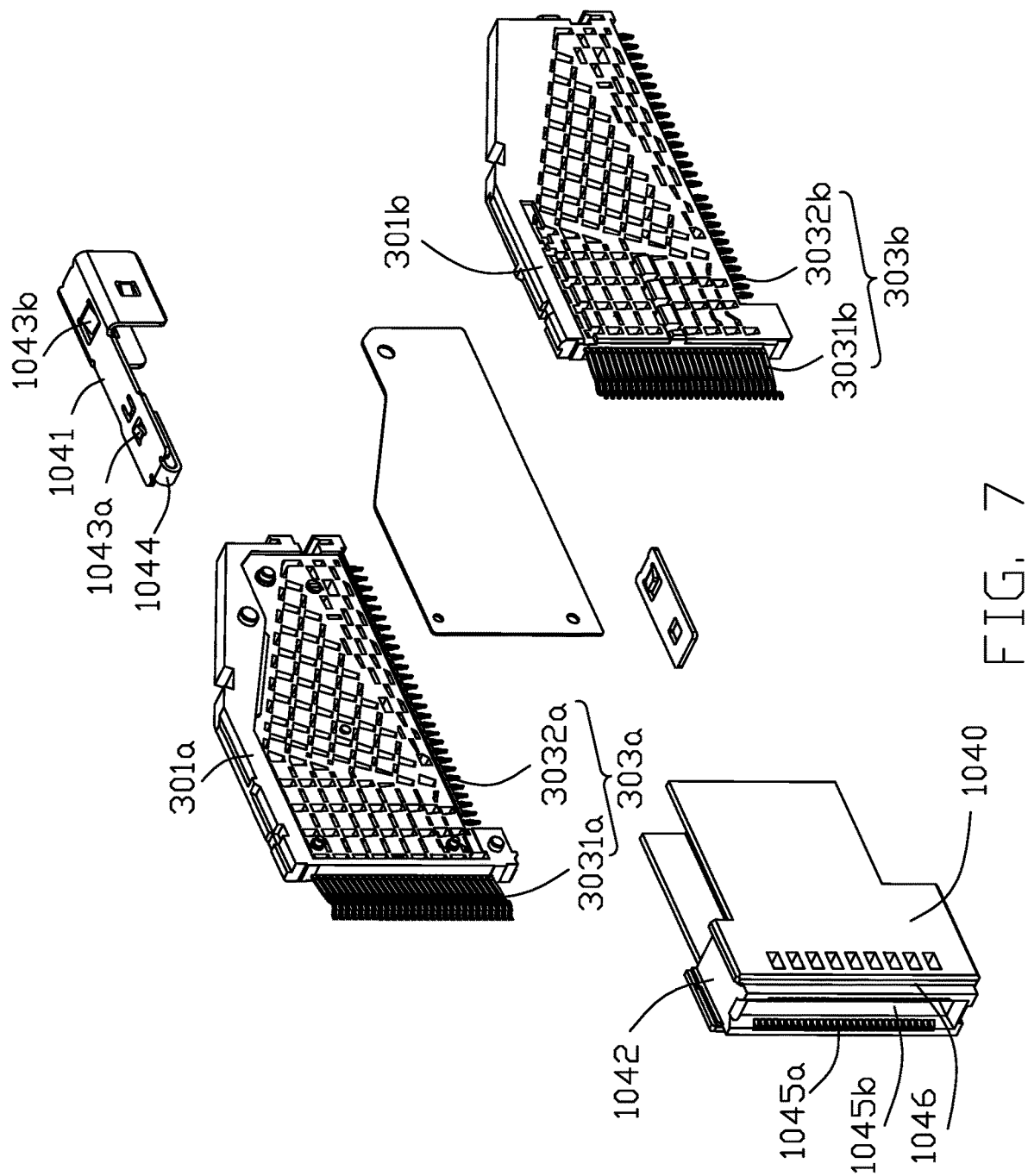
FIG. 7 is a further exploded perspective view of the electrical connector of FIG. 5.

Referring to FIGS. 4 and 7, preferably, the mating frame 12 open through in the front-rear direction. During an assembly of the connector 100, the insulative housing 104 is assembled into the metallic housing 102 firstly, and then each transition module 30 composed of the first wafer 301a and the second wafer 301b is forwardly installed into the corresponding frame 12. The insulative housing 104 includes a main portion 1040 and an attachment member 1041 located at an upper face of the corresponding frame 12. The attachment member 1041 is detachably plugged into the corresponding mating slot 1042 of the main portion 1040. The attachment member 1041 is provided with a first tab 1043a and a second tab 1043b formed by tearing the attachment member 1041. After the insulative housing 104 is inserted into the metallic housing 102, the first tab 1043a can be mated with the metallic housing 102 to prevent the insulative housing 104 from falling backward from the metallic housing 102. After the transition module 30 is inserted into the insulative housing 104, the second tab 1043b prevents the transition module 30 from falling backward from the insulative housing 104. The front end of the attachment member 1041 is provided with a hook 1044 extending into the slot inside the frame 12. The hook 1044 can not only hold the attachment member 1041 stably on the main portion 1040, but also form a guide face for the insertion of the card 20.

Referring to FIGS. 5 and 7, terminal grooves 1045a/1045b are respectively provided on both sides of the front end of the insulative housing 104. The terminal 303a/303b comprises a matching portion 3031a/3031b located on the first end of the transition module 30 for matching with the card 20. The matching portion 3031a/3031b is accommodated in the corresponding terminal groove 1045a/1045b. The insulative housing 104 is provided with slots 1046 on both sides of the matching portion 3031a/3031b. When the card 20 is inserted into the frame 12 and mated with the matching portion 3031a/3031b, the slots 1046 provide spaces for deformation of the matching portion 3031a/3031b. In addition, since of the matching portions 3031a and 3031b have relatively low impedance (stub effect), the slot 1046 increase an exposed area of the matching portions 3031a, 3031b to air near the slot, so that the impedance of the matching portions 3031a and 3031b are increased. The portions of the conductive terminals 303a, 303b located on the second end 302 are arranged longitudinally to form two rows of mounting portions 3032a/3032b connected to the printed circuit board. In the present invention, in order to facilitate the fixing process of the electrical connector 100 to the printed circuit board, the bracket 10 defines two holding portions 1021a, 1021b on an outermost thereof. The holding portions 1021a, 1021b are used to fix the bracket 10 to the printed circuit board, the two holding portions 1021a,1021b are staggered in the front-rear direction.

Figure 8:
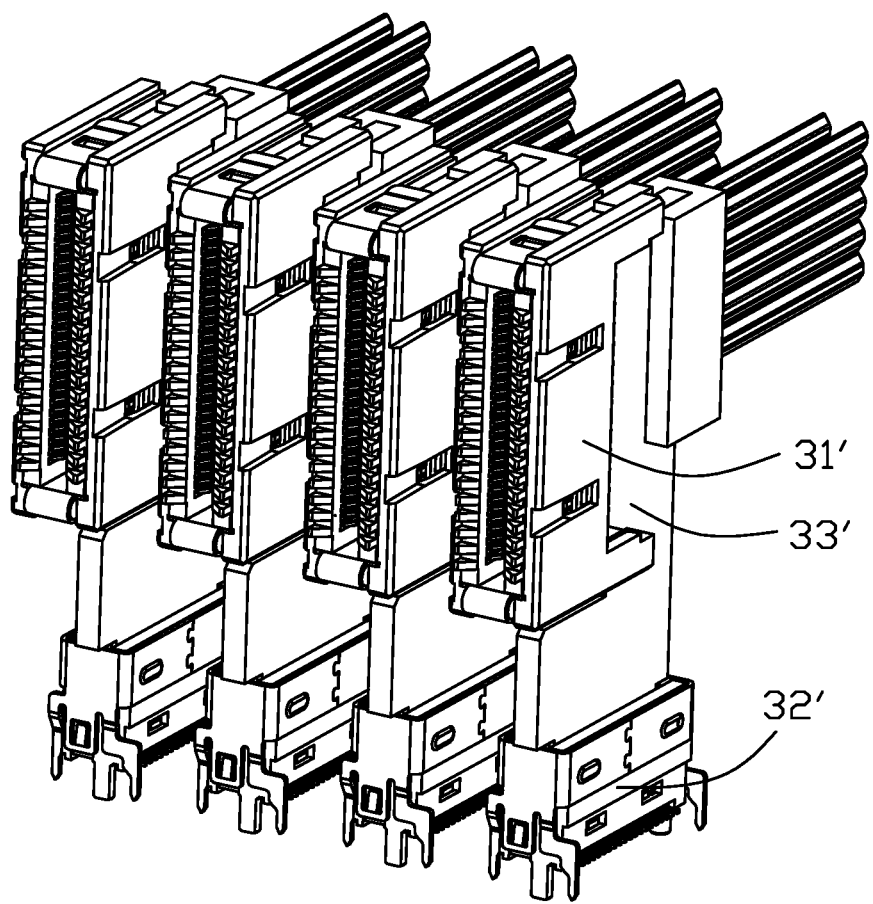
FIG. 8 is a perspective view of an electrical connector of a second embodiment of the present invention.

Referring to FIG. 8 illustrating an electrical connector of the second embodiment of the invention, the transition module comprises an internal printed circuit board (PCB) 33', a board-mount connector 32' connected to a first row of conductive pads (not shown) disposed at a bottom end portion of the PCB 33', and a plug-in connector 31' connected to a second row of conductive pads (not shown) disposed at a front end portion of the PCB 33'.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for connecting plural cards to a printed circuit board, comprising:
   a bracket having a plurality of mating frames arranged side by side in a lateral direction and opening forward for receiving the cards; and
   a plurality of transition modules inserted forward to be at least partially accommodated in the mating frames for electrically connecting the card and the printed circuit board;
   wherein the bracket defines a plurality of heat dissipation grooves each located between two adjacent frames and a plurality of heat dissipation fins each located in a corresponding heat dissipation groove, the heat dissipation groove opening through in a front-rear direction; and
   wherein the bracket comprises a metallic housing and a plurality of insulative housings, the metallic housing comprises a main body extending laterally and a plurality of walls extending rearward from the main body, the plurality of insulative housings are arranged in the main body to collectively form the mating frames, and each transition module is located between two adjacent walls.

2. The electrical connector as claimed in claim 1, wherein the heat dissipation grooves are disposed in the metallic housing, and the heat dissipation fins extend substantially parallel to the walls.

3. The electrical connector as claimed in claim 1, wherein the transition module defines a first end arranged in the frame and a second end for connecting with the circuit board, and each transition module comprises a first wafer and a second wafer each having a plurality of terminals extending from the first end to the second end.

4. The electrical connector as claimed in claim 1, wherein the insulative housing is located in the main body and extends rearward.

5. The electrical connector as claimed in claim 1, wherein the transition module comprises a housing and a plurality of terminals located in the housing, the terminal comprises a matching portion for matching with the card, and the insulative housing defines slots on both sides of the matching portion.

6. The electrical connector as claimed in claim 1, wherein the heat dissipation fins and side walls of the heat dissipation grooves are unitary, and a gap is defined between the heat dissipation fin and the two adjacent side walls.

7. The electrical connector as claimed in claim 1, wherein a front end of the heat dissipation fin is substantially flush with a front surface of the bracket.

8. The electrical connector as claimed in claim 1, wherein the bracket comprises a baffle wall upstanding in the heat dissipation groove, an outer periphery of the baffle wall is connected with an inner wall of the heat dissipation groove so that the baffle wall blocks the heat dissipation groove along the front-rear direction, and the heat dissipation fin is fixed in the heat dissipation groove by the baffle wall.

9. The electrical connector as claimed in claim 1, wherein the bracket comprises two outermost holding portions staggered in the front-rear direction.

10. An electrical connector comprising:
    a metallic housing defining a plurality of upright receiving slots along a lateral direction, each upright slot opening through along a front-rear direction with a mating face at a front side thereof, and a partition wall between every two adjacent upright slots; and
    a plurality of transition assemblies received in the upright slots, respectively;
    wherein the partition wall is divided into three parts along the lateral direction to form two heat dissipation sub-grooves at each partition wall.

11. The electrical connector as claimed in claim 10, wherein a front part and a rear part of the heat dissipation sub-groove is separated by a baffle wall, the front part only opening forward while the rear part opening rearward and opening through along an upright direction.

12. An electrical connector comprising:
    a housing having a main body defining a plurality of receiving slots along a lateral direction, a front partition wall between every two receiving slots, and a plurality of rear partition walls extending from a rear face of the main body, the receiving slot extending rearward between every two adjacent partition walls; and
    a plurality of transition assemblies having conductive elements and being received in the receiving slots;
    wherein the front partition wall defines a front heat dissipation groove opening forwards and a heat dissipation fin in the front heat dissipation groove, the rear partition wall includes three extending walls extending from the rear face of the main body, the three extending walls are separated from each other in the lateral direction.

13. The electrical connector as claimed in claim 12, wherein the heat dissipation fin is aligned with a middle extending wall of the three extending walls.

14. The electrical connector as claimed in claim 13, wherein the front heat dissipation groove is baffled rearwards.

15. An electrical connector for connecting plural cards to a printed circuit board, comprising:
    a bracket having a plurality of mating frames arranged side by side in a lateral direction and opening forward for receiving the cards; and
    a plurality of transition modules inserted forward to be at least partially accommodated in the mating frames for electrically connecting the card and the printed circuit board;
    wherein the bracket defines a plurality of heat dissipation grooves each located between two adjacent frames and a plurality of heat dissipation fins each located in a corresponding heat dissipation groove, the heat dissipation groove opening through in a front-rear direction; and
    wherein the bracket comprises a baffle wall upstanding in the heat dissipation groove, an outer periphery of the baffle wall is connected with an inner wall of the heat dissipation groove so that the baffle wall blocks the heat dissipation groove along the front-rear direction, and the heat dissipation fin is fixed in the heat dissipation groove by the baffle wall.

* * * * *